Figure 1:
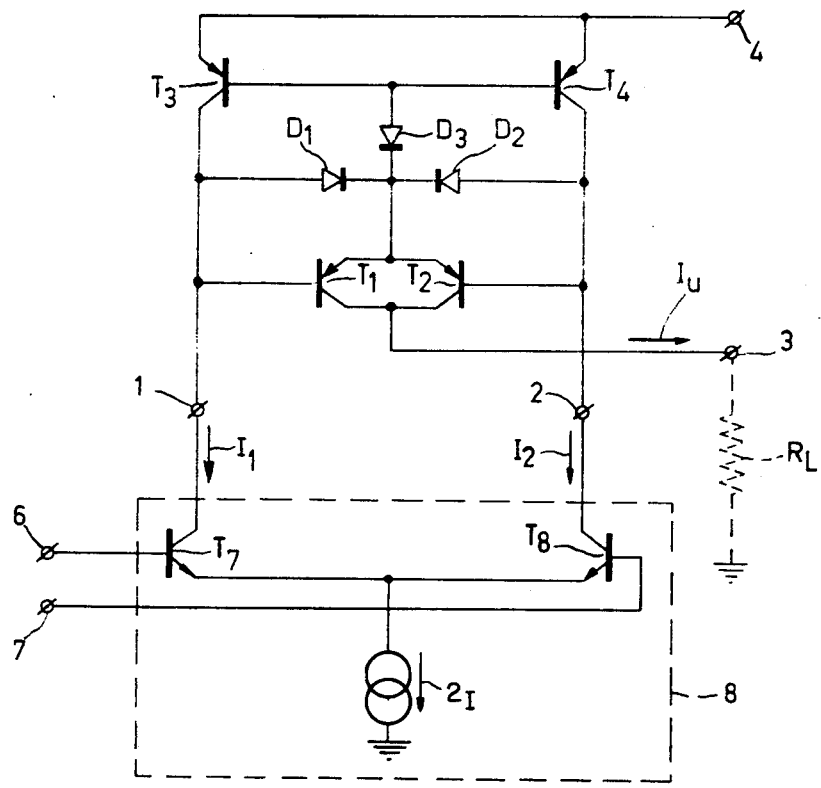

United States Patent [19]

van de Plassche

[11] 4,053,796
[45] Oct. 11, 1977

[54] RECTIFYING CIRCUIT

[75] Inventor: Rudy J. van de Plassche, Eindhoven, Netherlands

[73] Assignee: U.S. Philips Corporation, New York, N.Y.

[21] Appl. No.: 705,049

[22] Filed: July 14, 1976

[30] Foreign Application Priority Data

July 23, 1975 Netherlands .................. 7508771

[51] Int. Cl.² ........................................... H03K 5/00
[52] U.S. Cl. ................................. 307/261; 307/229; 307/296 R; 328/26
[58] Field of Search .............. 307/229, 260, 261, 270, 307/296, 291; 330/30 D; 328/26

[56] References Cited

U.S. PATENT DOCUMENTS

| 3,764,925 | 10/1973 | Von Nikelsberg et al. | 330/30 D |
| 3,805,093 | 4/1974 | Hodemaekers | 330/30 D |
| 3,917,991 | 11/1975 | Ota et al. | 328/26 X |

Primary Examiner—John Zazworsky

Attorney, Agent, or Firm—Frank R. Trifari; Bernard Franzblau

[57] ABSTRACT

A rectifying circuit for balanced input currents, of which the two components are applied to a first and a second point of a selective current mirror circuit respectively, either the first point constituting the input and the second point the output, or the first point constituting the output and the second point the input of the selective current mirror circuit, depending on and under control of the polarity of the difference between the two components. As a result, the selective current mirror circuit follows either the greater or the smaller of the two components of the balanced input current. The first and the second point are each connected to the output terminal of the rectifying circuit via a current circuit. These current circuits each have a reverse direction and each comprise the main current path of a transistor for transferring the difference between the output current of the selective current mirror circuit and the component of the balanced input current which is applied to the relevant output to the output terminal in a voltage decoupling manner.

10 Claims, 5 Drawing Figures

RECTIFYING CIRCUIT

The invention relates to a rectifying circuit for signal currents which can be applied to a first and a second terminal in push-pull, with an output at which the rectified signal currents are available.

Rectifying circuits are inter alia employed in voltmeters. Known rectifying circuits utilize a diode bridge. These bridges have the disadvantage that the output level on which the rectified signal is superimposed, is almost completely determined by the input level. Furthermore with these rectifiers it is frequently a problem to obtain a single-ended output signal, for example relative to ground.

It is an object of the invention to provide a rectifying circuit which does not have these problems.

The invention is therefore characterized in that the first and the second input terminal are coupled to a supply terminal via a first and a second current circuit respectively, which first and second current circuit are mutually coupled via a selective current mirror circuit for coupling the current which flows in the one current circuit to the other current circuit with a current gain of substantially unity, depending on the polarity of the difference between the signal currents which are applied to the first and the second input terminal respectively, the first and the second input terminal being coupled to an output terminal which constitutes said output, via a third and a fourth current circuit respectively, which third and fourth current circuit each have a reverse and forward directions which are mutually the same and each comprise the main current path of a transistor, whose current output electrodes are coupled to the output terminal.

In this respect current output electrode is to be understood to mean that electrode of the main current path which presents the highest internal impedance, i.e. the collector electrode of a bipolar transistor or the drain electrode of a field effect transistor.

By means of the steps in accordance with the invention the following is achieved; if a balanced current consisting of a common-mode component, which is the average of the two input currents, and a signal component which appears at the two input terminals in phase opposition, is applied to the two input terminals, currents will flow in the first and the second current circuit owing to the selective current mirror circuit, which currents are substantially equal to either the greater or the smaller of the two input currents depending on the circuit arrangement of the selective current mirror circuit. The difference, i.e. twice the signal component, will flow to the output terminal through the third or the fourth current circuit. Consequently, the full-wave rectified signal component, which has been amplified twice will appear at the output terminal. As the output terminal is coupled to the current output electrodes of transistors whose main current paths are included in the third and the fourth current circuit, the output terminal is connected to the input terminals in a voltage decoupling manner. As the third and the fourth current circuit have a blocking direction, it is ensured that the selective current mirror circuit selects one of the two currents which can be applied to the first and the second input terminal as input current and does not derive an input current via the third or the fourth current circuit.

Figure 2:
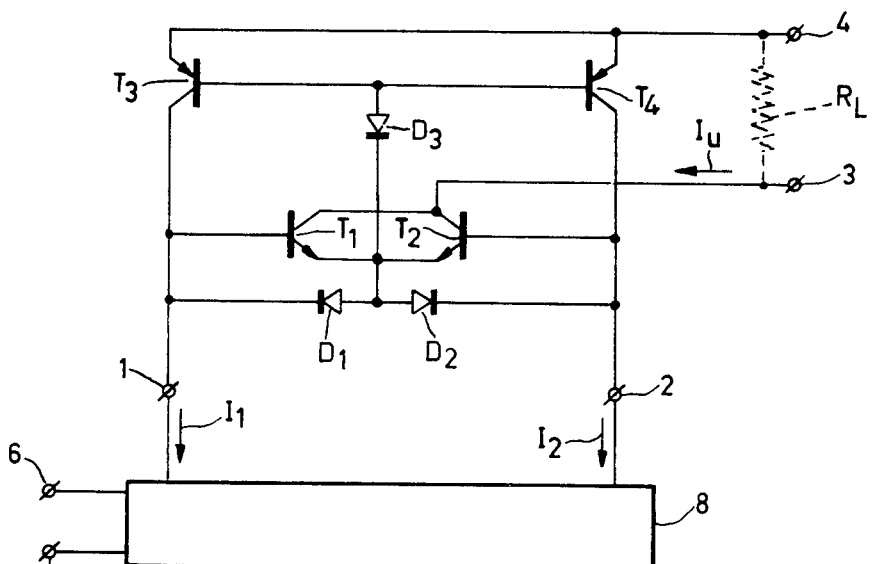
Figure 3:
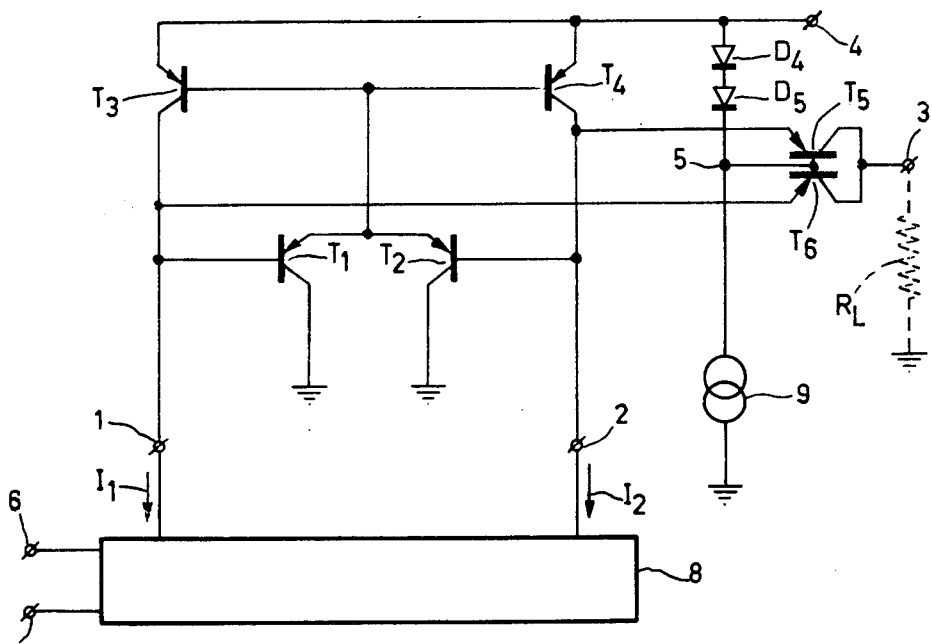
Figure 4:
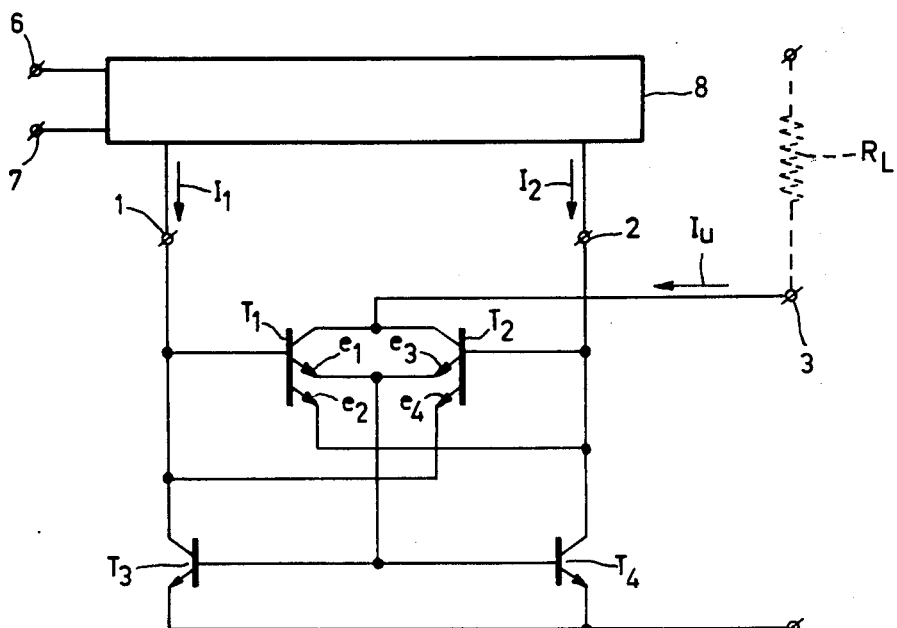
Figure 5:
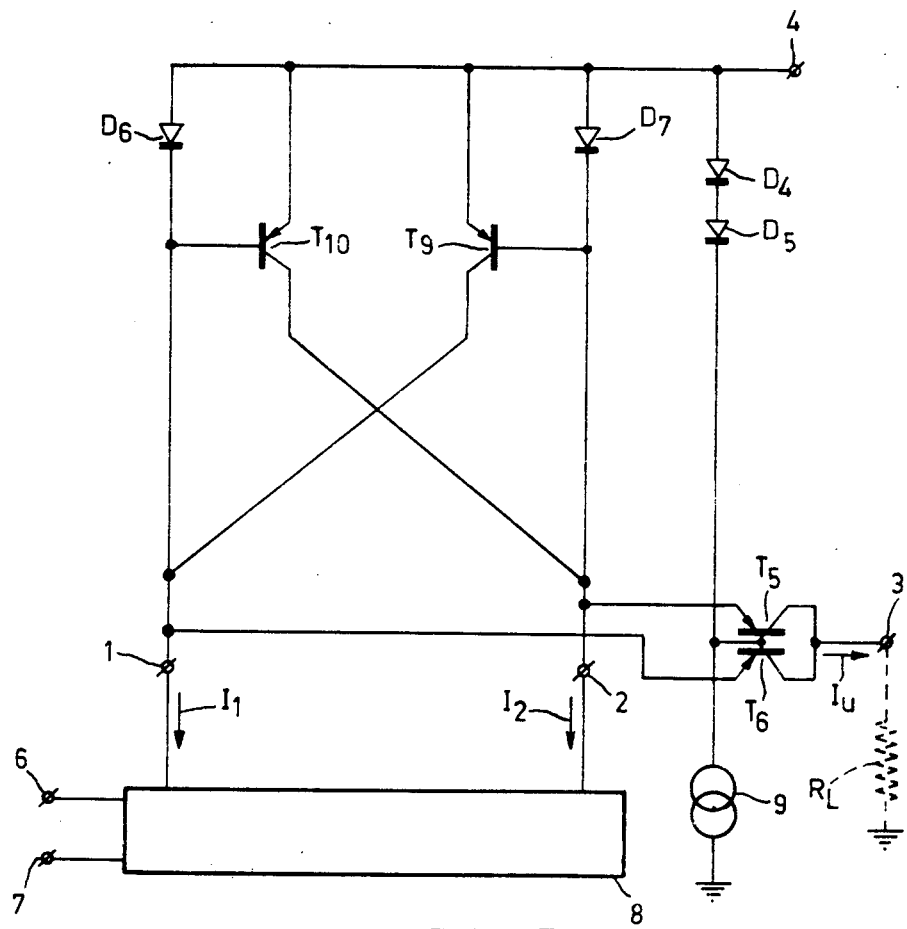

The invention will be described in more detail with reference to the drawing, in which FIG. 1 shows a first example of a rectifying circuit in accordance with the invention, FIG. 2 shows a second example, the output current flowing in a direction opposite to that in the first example, FIG. 3 shows a third example with an alternative output circuit, FIG. 4 shows a fourth example with npn transistor, and FIG. 5 shows a fifth example with a bistable selective current mirror circuit.

In FIG. 1 the pnp-transistors $T_1$, $T_2$, $T_3$ and $T_4$ constitute the selective current mirror circuit. The base-emitter junctions of the transistors $T_3$ and $T_4$ are connected in parallel. The transistors $T_3$ and $T_4$ are assumed to be identical, which can be realized with very good approximation in integrated circuit technology. As a result, the currents through the transistors $T_3$ and $T_4$ are equal. The collector of transistor $T_3$ is connected to the first input terminal 1 and the collector of transistor $T_4$ to the second input terminal 2. The emitters of the transistors $T_3$ and $T_4$ are connected to a supply terminal 4. The main current paths of the transistors $T_3$ and $T_4$ thus constitute the first and the second current circuit respectively. The emitters of the transistors $T_1$ and $T_2$ are connected to the base of the transistors $T_3$ and $T_4$ via a diode $D_3$, which causes a voltage shift. The bases of the transistors $T_1$ and $T_2$ are connected to the input terminal 1 and 2 respectively and the collectors of the transistors $T_1$ and $T_2$ are connected together and to the output terminal 3, to which a load $R_L$ may be connected. The input terminals 1 and 2 are interconnected via the series-opposition arrangement of two diodes $D_1$ and $D_2$, whose cathodes are connected to the emitters of the transistors $T_1$ and $T_2$.

As is shown in the Figure, the currents $I_1$ and $I_2$ flow through the input terminals 1 and 2 respectively. These currents comprise a common-mode component I, which equals $\frac{1}{2}(I_1 + I_2)$ and a signal component i, i.e. $I_1 = I + i$ and $I_2 = I - i$. This balanced current may be applied to the input terminals 1 and 2 by a voltage-current convertor 8, which may for example be constituted by two transistors $T_7$ and $T_8$ connected as a differential pair. The collectors of transistors $T_7$ and $T_8$ are connected to the input terminals 1 and 2 respectively, their emitters are jointly connected to a current source which carries a current 2I, and their bases are connected to input terminals 6 and 7, respectively.

If the signal component i equals zero, or if the current $I_1$ equals the current $I_2$, these currents will flow through the collector-emitter paths of the transistors $T_3$ and $T_4$, whose base currents flow through the transistors $T_1$ and $T_2$. The diodes $D_1$ and $D_2$, which are connected in antiparallel to the base-emitter diodes of the transistors $T_1$ and $T_2$, are then reverse-biassed. Apart from the base currents of the transistors $T_3$ and $T_4$, no current flows through the output terminal 3. When the signal component i becomes positive, or if the current $I_1$ slightly increases and the current $I_2$ slightly decreases, and if the transistors $T_3$ and $T_4$ initially carry the common-mode current I, the base current of transistor $T_1$ should increase and the base current of transistor $T_2$ should decrease. For comparatively small signal components this already results in transistor $T_2$ being cut off. Via the base-emitter junction of transistor $T_1$ transistor $T_3$ receives further positive feedback, so that the collector current of transistor $T_3$, apart from the base current of transistor $T_1$, keeps following the input current $I_1$. Consequently, the collector current of transistor $T_4$ also follows the input current $I_1$. As the current $I_2$ is smaller than the collector current of transistor $T_4$ and as transistor $T_2$ no longer draws any base current, the collector-base voltage of transistor $T_4$ will increase until diode $D_2$ becomes forward biassed and carries the difference between the collector current of transistor $T_4$, which substantially equals the input current $I_1$, and the current $I_2$. Via the emitter-collector path of transistor $T_1$ this difference appears at the output terminal 3. The circuit including the diode $D_2$ and the emitter-collector path of transistor $T_1$ thus constitutes the fourth current circuit.

In a symmetrical manner, if the signal component $i$ becomes negative, transistor $T_1$ will be cut off and diode $D_2$ will be reverse-biassed. The collector currents of the transistors $T_3$ and $T_4$ will then become substantially equal to the current $I_2$. Through diode $D_1$ and the emitter-collector path of transistor $T_2$ substantially the difference between the currents $I_1$ and $I_2$, i.e. $-2i$, will flow to the output terminal. The circuit including the diode $D_1$ and the emitter-collector path of transistor $T_2$ thus constitutes the third current circuit. The current $I_u$, which as shown in FIG. 1 flows through the ouput terminal 3, equals twice the absolute value of the signal component $i$, or twice the full-wave rectified signal component $i$ when the base currents are neglected.

If a rectifying circuit is required in which the current $I_u$ flows in an opposite direction, use can be made of the circuit arrangement of FIG. 2.

In the circuit arrangement of FIG. 2, compared with the circuit arrangement of FIG. 1, the diodes $D_1$ and $D_2$ have been reversed and the transistors $T_1$ and $T_2$ have been replaced by transistors $T_1$ and $T_2$ of the npn-conductivity type.

If the currents $I_1$ and $I_2$ are equal, these currents will flow through the collector-emitter paths of the transistors $T_3$ and $T_4$. The base currents of the transistors $T_3$ and $T_4$ flow through the diodes $D_1$, $D_2$ and $D_3$. The transistors $T_1$ and $T_2$ are then reverse biassed. When the signal component $i$ becomes positive, or the current $I_1$ slightly increases and the current $I_2$ slightly decreases, and if the transistors $T_3$ and $T_4$ initially keep carrying the common-mode currents $I$, the current through diode $D_1$ increases and that through diode $D_2$ decreases. If the signal component $i$ is sufficiently large, diode $D_2$ will no longer carry any current and will be reverse-biassed. In the case of a further decrease of the current $I_2$, the difference between the collector current of transistor $T_4$ and the current $I_2$ will be derived from the base of transistor $T_2$, so that transistor $T_2$ becomes conductive. Via diode $D_3$ the base of transistor $T_4$ is voltage coupled to the emitter of transistor $T_2$, whose base is connected to the collector of transistor $T_4$. A low impedance coupling is established between the collector and base of transistor $T_4$ so that transistor $T_4$ is able to conduct the current $I_2$. In contradistinction to the circuit arrangement of FIG. 1, the transistors $T_3$ and $T_4$ consequently carry the smaller of the currents $I_1$ and $I_2$. The difference between the collector current of transistor $T_3$, which substantially equals $I_2$, and the current $I_1$ flows via diode $D_1$, the emitter-collector path of transistor $T_2$, and the output terminal 3.

In a symmetrical manner, if the signal component $i$ is negative, transistor $T_1$ and diode $D_2$ will conduct, whereas transistor $T_2$ and diode $D_1$ are reverse-biassed. Consequently, the current $I_u$ will be substantially twice the full-wave rectified signal component $i$.

FIG. 3 shows a modification of the circuit arrangement of FIG. 1. The selective current mirror circuit, constituted by the transistors $T_1$, $T_2$, $T_3$ and $T_4$ corresponds to the circuit arrangement of FIG. 1. The third and the fourth current circuit between the input terminals 1 and 2 respectively and the output terminal 3 are constituted by the emitter-collector paths of the pnp-transistors $T_6$ and $T_5$ respectively. The emitters of transistors $T_6$ and $T_5$ are connected to the input terminals 1 and 2 respectively, the collectors to the output terminal 3, and the bases to a point 5, to which a suitable reference voltage should be applied, for example as is shown in FIG. 3, by connecting this point 5 via two diodes $D_4$ and $D_5$ to the supply terminal 4, through which diodes a bias current flows which is supplied by a current source 9.

This circuit arrangement has the advantage that in the case of integrated circuits, the transistors $T_1$ and $T_2$ may comprise vertical substrate pnp-transistors (these are vertical pnp transistors whose collector is constituted by the substrate of the integrated circuit) which have a substantially higher current gain factor than lateral integrated pnp transistors.

If the currents $I_1$ and $I_2$ are equal, the transistors $T_3$ and $T_4$ again substantially carry the common-mode currents $I$. The base currents of the transistors $T_3$ and $T_4$ flow through the collector-emitter paths of the transistors $T_1$ and $T_2$. The transistors $T_5$ and $T_6$ are then reverse-biassed by a suitable bias voltage at point 5. As a result, in contradistinction to the circuit arrangement of FIG. 1, no current will flow through the output terminal 3 in the case where the signal component $i$ is zero. In a modification of FIG. 3, this bias voltage could also be obtained by connecting point 5 to the emitters of the transistors $T_1$ and $T_2$.

When the signal component $i$ becomes positive transistor $T_2$ will be reverse-biassed, as in the circuit arrangement of FIG. 1, and the collector currents of the transistors $T_3$ and $T_4$ will follow the current $I_1$. As the current $I_2$ has decreased and the transistor $T_4$, which carries a current which is substantially equal to $I_1$, presents an active load to the current $I_2$, the base-emitter voltage of transistor $T_5$ increases until this transistor is forward biassed and carries the difference between collector current of transistor $T_4$ and the current $I_2$. This difference substantially equals $2i$.

In a symmetrical way, if the signal component $i$ is negative, the transistors $T_1$ and $T_5$ will be reverse-biassed and the transistors $T_2$ and $T_6$ will be forward-biassed. The difference between the collector current of transistor $T_3$ and the current $I_1$, which difference is substantially $-2i$, then flows through the emitter-collector path of transistor $T_6$.

FIG. 4 shows an example of a rectifying circuit in accordance with the invention, use being made of npn transistors, which in integrated circuits has the advantage that the influence of the base currents is substantially reduced. The selective current mirror circuit comprises the npn transistors $T_3$ and $T_4$, which are assumed to be identical, and two npn transistors $T_1$ and $T_2$ with double emitters. For the selective current mirror circuit the emitters $e_1$ and $e_3$ respectively are of importance. The third current circuit between the input terminal 1 and the output terminal 3 is constituted by the main current path of transistor $T_2$ with emitter $e_4$ and the fourth current circuit between the input terminal 2 and the output terminal by the main current path of transistor $T_1$ with emitter $e_2$. The collectors of the transistors $T_1$ and $T_2$ are connected to the output terminal 3, the bases to the input terminals 1 and 2 respectively, the first emitters $e_1$ and $e_3$ to the common-base electrode of the transistors $T_3$ and $T_4$, and the second emitters $e_2$ and $e_4$ to the input terminals 2 and 1 respectively. The bases of the transistors $T_3$ and $T_4$ are interconnected, the emitters are connected to the supply terminal 4 and the collectors to the input terminals 1 and 2 respectively.

If the currents $I_1$ and $I_2$ are equal, the transistors $T_3$ and $T_4$ carry the common-mode currents I. The base currents of the transistors $T_3$ and $T_4$ are applied to the emitters $e_1$ and $e_3$ respectively via the main current paths of the transistors $T_1$ and $T_2$. The base-emitter junctions are then conductive in respect of the emitters $e_1$ and $e_3$. As the emitters $e_2$ and $e_4$ are connected to the bases of the transistors $T_2$ and $T_1$ respectively, the base-emitter junctions associated with the emitters $e_2$ and $e_4$ are reverse-biassed.

If the signal component i becomes positive, or if the current $I_1$ increases slightly and the current $I_2$ decreases slightly, the base current of transistor $T_1$ increases and the base current of transistor $T_2$ decreases. In the case of a sufficiently large signal component i transistor $T_2$ will then be reverse-biassed in respect of the two base-emitter junctions. As the base currents for the transistors $T_3$ and $T_4$ are then completely supplied via the emitter $e_1$ of transistor $T_1$ this results in a positive feedback between collector and base of transistor $T_3$ via the base-emitter junction of transistor $T_1$ in respect of the emitter $e_1$. The collector current of transistor $T_3$ and thus of transistor $T_4$ will substantially follow the current $I_1$. Owing to the active load which the collector of transistor $T_4$ presents to the current $I_2$, which current decreases the voltage between the base and the emitter $e_2$ of transistor $T_1$ will increase until the difference between the collector current of transistor $T_4$, which substantially equals the current $I_1$, and the current $I_2$ flows via the emitter $e_2$. This current which is substantially equal to 2i then also flows through the output terminal 3.

If the signal component i is sufficiently negative, the base-emitter junctions of transistor $T_2$ will be forward biassed, in a symmetrical manner, and the two base-emitter junctions of transistor $T_1$ will be reverse-biassed. The current $I_u$ is then substantially equal to $-2i$.

In the rectifying circuits in accordance with the preceding Figures the signal component i should always be sufficiently positive or negative to bias one of the transistors $T_1$ and $T_2$ in the reverse direction and the other in the forward direction. The selective current mirror circuit consequently has a linear range. FIG. 5 shows a rectifying circuit in accordance with the invention in which the selective current mirror circuit has a minimal linear range and behaves as a bistable trigger.

The selective current mirror circuit of the rectifying circuit in accordance with FIG. 5 comprises two current mirrors. The first current mirror consists of a transistor $T_{10}$ of the pnp type, whose emitter is connected to the supply terminal 4, whose collector is connected to the input terminal 2, and whose base is connected to the input terminal 1. A diode $D_6$ shunts the base-emitter junction of transistor $T_{10}$, the cathode of diode $D_6$ being connected to the base of transistor $T_{10}$. Diode $D_6$ and transistor $T_{10}$ thus constitute a current mirror whose input is connected to the input terminal 1, whose output is connected to the input terminal 2, and whose common terminal is connected to the supply terminal 4. In a similar way a diode $D_7$ and a pnp-transistor $T_9$ form a second current mirror, whose input is connected to the input terminal 2, whose output is connected to the input terminal 1, and whose common terminal is connected to the supply terminal 4. The two current mirrors should have a current mirror ratio equal to 1, which in integrated circuits is generally realized by selecting as the diode a transistor which is identical to the associated transistor and which has its base connected to its collector.

The input terminals 1 and 2 are connected to the outputs of a voltage-current convertor 8 and each via the emitter-collector path of a pnp transistor $T_6$ and $T_5$ respectively to the output terminal 3. The base of the transistors $T_5$ and $T_6$ are connected to a point of fixed voltage, which point via the series connection of the two diodes $D_4$ and $D_5$ is connected to the supply terminal 4. Through these diodes a bias current flows which is supplied by a current source 9.

If the signal component i is zero, i.e. when the currents $I_1$ and $I_2$ equal the common-mode component I, the current $I_1 = I$ divides over the diode $D_6$ and the main-current path of transistor $T_9$, and the current $I_2 = I$ over the diode $D_7$ and the main current path of transistor $T_{10}$. If the two current mirrors are identical, the input and output currents of both current mirrors will equal ½I. The bias voltage at the base electrodes of the transistors $T_5$ and $T_6$ should then be such that the transistors are not conducting. For this, the voltage drop across the series connection of the diodes $D_4$ and $D_5$ should be smaller than the sum of voltage which is produced across the diode $D_6$ or $D_7$ by a current ½I and the base-emitter-voltage at which the emitter-collector current of the corresponding transistor $T_6$ or $T_5$ begins to flow.

If the signal component i becomes positive, or if the current $I_1$ slightly increases and the current $I_2$ slightly decreases, the current through diode $D_6$ slightly increases and the current through diode $D_7$ slightly decreases. The increase of the current through diode $D_6$ causes an increase of the collector current of transistor $T_{10}$, which aids the decrease of the current through diode $D_7$. The decrease of the current through diode $D_7$ causes a decrease of the collector current of transistor $T_9$, which promotes the increase of the current through diode $D_6$. Owing to this unstable process the diode $D_6$ will carry the current $I_1$ after a slight increase of the current $I_1$ relative to the current $I_2$, while the current mirror, which is constituted by the diode $D_7$ and transistor $T_9$ is currentless. Through the input terminal 2 a current $I_2$ flows, while the collector current of transistor $T_{10}$ equals $I_1$. As diode $D_7$ carries no current, it is possible that the base-emitter junction of transistor $T_5$ is forward biassed. The difference between the current $I_1$ and the current $I_2$, i.e. 2i, will flow via the emitter-collector path of transistor $T_5$ and the output terminal 3.

If the current $I_2$ is slightly greater than the current $I_1$, i.e. the signal component i is negative, the same thing happens as in the case of a positive signal component, in a symmetrical way. The current mirror constituted by the diode $D_6$ and transistor $T_{10}$ will be currentless and the current mirror constituted by diode $D_7$ and transistor $T_9$ will carry a current $I_2$. Via the emitter-collector path of transistor $T_6$ a current equal to $-2i$ will flow to the output terminal 3.

The rectifying circuit in accordance with FIG. 5 may alternatively be equipped with different types of current mirrors, provided that these have a current mirror ratio of 1.

The invention is not limited to the examples shown. Several modifications are possible in accordance with the principle of the invention.

What is claimed is:

1. A rectifying circuit comprising first and second input terminals for receiving input currents which can exhibit a difference, which difference can be of a first or a second polarity, an output terminal, an electric supply terminal, a first current circuit connected between the first input terminal and the supply terminal, a second current circuit connected between the second input terminal and the supply terminal, current mirror circuit means coupling said first and second current circuits together so as to maintain substantially equal currents in said first and second current circuits, said current mirror circuit means including means responsive to the polarity of the difference between the currents applied to the first and second input terminals for making the first current circuit low-ohmic relative to the second current circuit for the first polarity of said difference whereby the current applied to the first input terminal is reproduced in the second current circuit by the current mirror circuit means, and for making the second current circuit low-ohmic relative to the first current circuit for the second polarity of said difference whereby the current applied to the second input terminal is reproduced in the first current circuit by the current mirror circuit means, third and fourth current circuits connected between the first and second input terminals, respectively, and the output terminal, said third and fourth current circuits each having a unidirectional current flow direction which are the same and each comprise the main current path of a transistor having a current output electrode coupled to the output terminal.

2. A rectifying circuit as claimed in claim 1 wherein the current mirror circuit means comprises first and second transistors of the same conductivity type which carry equal collector currents for equal base-emitter voltages, means interconnecting the base electrodes of the first and second transistors, means connecting the emitters of said first and second transistors to the supply terminal and the collectors to the first and second input terminals respectively, a third and a fourth transistor of the same conductivity type, and means connecting the third and fourth transistor base electrodes to the first and second input terminals respectively, and the emitter electrodes to the base electrodes of the first and second transistors.

3. A rectifying circuit as claimed in claim 1 wherein the current mirror circuit means comprises a first and a second current mirror each with a current mirror ratio of substantially unity and an input and an output, means connecting the first current mirror input to the first input terminal and the output to the second input terminal, and means connecting the second current mirror input to the second input terminal and the output to the first input terminal.

4. A rectifying circuit as claimed in claim 2 wherein the third and fourth current circuits respectively comprise the main current paths of fifth and sixth transistors of the same conductivity type, means connecting the fifth and sixth transistor emitter electrodes to the first and the second input terminals respectively, the collector electrodes to the output terminal, and the base electrodes to a reference voltage point.

5. A rectifying circuit as claimed in claim 2, wherein the base-emitter junctions of the third and fourth transistors are shunted by first and second semi-conductor junctions respectively, said first and second semi-conductor junctions having forward directions which are opposite to the forward directions of the base-emitter junctions of the third and fourth transistors respectively, and means connecting the collector electrodes of said third and fourth transistors to the output terminal.

6. A rectifying circuit as claimed in claim 2 wherein the third and fourth transistors are of the same conductivity type as the first and second transistors, the rectifying circuit further comprising fifth and sixth transistors of the same conductivity type as the third and fourth transistors, means connecting the fifth and sixth transistor base electrodes to the base electrodes of the third and fourth transistors respectively, and means connecting the emitter electrodes of the fifth and sixth transistors to the second and first input terminals respectively and the collectors to the output terminal.

7. A rectifying circuit as claimed in claim 3 wherein the third and fourth current circuits respectively comprise first and second transistors having input electrodes respectively connected to said first and second input terminals, output electrodes connected to the output terminal and control electrodes connected to a source of reference potential.

8. A rectifying circuit as claimed in claim 2 further comprising first and second semiconductor rectifying junctions connected between said first and second input terminals and the emitter electrodes of said third and fourth transistors, respectively, and wherein the means connecting the emitter electrodes of the third and fourth transistors to the base electrodes of the first and second transistors includes a third semiconductor rectifying junction.

9. A rectifying circuit as claimed in claim 1 further comprising a voltage-current converter having first and second input terminals adapted to receive first and second input signals and first and second output terminals directly connected to said rectifying circuit first and second input terminals, respectively.

10. A rectifying circuit as claimed in claim 1 wherein the third and fourth current circuits respectively comprise the emitter-collector paths of first and second transistors of the same conductivity type, and means connecting the first and second transistor emitter electrodes to the first and second input terminals respectively, the collector electrodes to the output terminal and the base electrodes to a point of reference voltage.

* * * * *